United States Patent

Nakamura

[11] Patent Number: 5,436,490
[45] Date of Patent: Jul. 25, 1995

[54] SEMICONDUCTOR DEVICE HAVING FERROELECTRICS LAYER

[75] Inventor: Takashi Nakamura, Kyoto, Japan

[73] Assignee: Rohm Co., Ltd., Kyoto, Japan

[21] Appl. No.: 964,212

[22] Filed: Oct. 20, 1992

[30] Foreign Application Priority Data

Oct. 26, 1991 [JP] Japan ............................. 3-306561

[51] Int. Cl.$^6$ ............................................. H01L 29/78
[52] U.S. Cl. ........................................ 257/410; 257/295
[58] Field of Search ........................ 257/295, 410, 411

[56] References Cited

U.S. PATENT DOCUMENTS

| 2,791,760 | 5/1957 | Ross | 257/295 |
| 2,791,761 | 5/1957 | Morton | 257/295 |
| 4,747,671 | 5/1988 | Takahashi et al. | 350/336 |
| 5,119,154 | 6/1992 | Gnadinger | 257/295 |
| 5,189,594 | 2/1993 | Hoshiba | 257/295 |
| 5,191,510 | 3/1993 | Huffman | 257/295 |
| 5,229,309 | 7/1993 | Kato | 257/295 |

FOREIGN PATENT DOCUMENTS

| 0004370 | 1/1987 | Japan | 257/295 |
| 0094571 | 4/1990 | Japan | 257/295 |
| 0183569 | 7/1990 | Japan | 257/295 |
| 0227052 | 10/1991 | Japan | 257/295 |
| 0013465 | 9/1991 | WIPO | 257/295 |

OTHER PUBLICATIONS

Yamauchi, "A metal Insulator Semiconductor Device Using A Ferroelectric Polymer Thin Film in the Gate Insulator", Japanese Journal of Applied Physics, vol. 25, No. 4, Apr. 1986 pp. 590–594.

Sugibuchi, "Ferroelectric field effect memory device using $Bi_4Ti_3 12$ film", Journal of Applied Physics, vol. 46, No. 7, Jul. 1975 pp. 2877–2882.

Primary Examiner—Rolf Hille
Assistant Examiner—David Ostrowski
Attorney, Agent, or Firm—Brumbaugh, Graves, Donohue & Raymond

[57] ABSTRACT

A semiconductor device includes a semiconductor substrate, impurity diffusion layers formed in the surface portions of the semiconductor substrate with a desired gap therebetween, an insulator layer bridged between the impurity diffusion layers on the semiconductor substrate and an electrode stacked on the insulator layer. The insulator layer is formed of a ferroelectric of IV-VI compound.

8 Claims, 1 Drawing Sheet

SEMICONDUCTOR DEVICE HAVING FERROELECTRICS LAYER

BACKGROUND OF THE INVENTION

The present invention relates to an M F S (Metal-Ferroelectric-Semiconductor) type semiconductor device, which has a structure in which the oxide of a MOS (Metal-Oxide-Semiconductor) type semiconductor device is replaced by a ferroelectric.

As a ferroelectric layer of the MFS type semiconductor device, an oxide ferroelectric has been used.

However, when an oxide ferroelectric is directly formed on a silicon substrate, the following problems are generated.

(1) Unnecessary film of such as $SiO_2$ is formed on an interface between a ferroelectric and a semiconductor substrate.

Nevertheless, in order to reverse the polarization in ferroelectric, it is necessary to apply voltage between an upper electrode and the semiconductor substrate and generate an electric field in the ferroelectric. When unnecessary film is formed on an interface between a ferroelectric and a semiconductor substrate, the structure becomes a structure of a stacked capacitor. Thus, the voltage to be applied must be increased to generate a sufficient electric field in the ferroelectric.

Further, the trap level is increased due to the formation of the unnecessary film so that electrons, etc., are trapped in the interface and the film, with the result that the required property cannot be obtained.

(2) The high temperature treatment is needed.

The crystallizing temperature of oxide ferroelectric is generally high and if heating at about 600° C. is not provided, for example, PZT is not crystallized. This leads to a large problem in the diffusion of Pb, etc., into the semiconductor substrate and the integrity of Si process.

(3) The crystal structure is complex and problems derived therefrom are generated.

It is necessary for oxide ferroelectric to be made a mixed crystal type having three elements or more. Since the crystal structure is complex, there arise problems such as the difficulty in film formation and working and the deterioration of crystallization due to the polarization reversal.

To solve such problems, use of fluoride ($BaMgF_4$) as the ferroelectric layer has been proposed. In this case, the possibility of solving the above described problem (1) exists. Nevertheless, the above problems (2) and (3) cannot be solved.

SUMMARY OF THE INVENTION

The present invention was made in view of the above-mentioned conventional technical problems. An object of the present invention is to provide an MFS type semiconductor device in which an oxide is not used, the high temperature treatment is not required due to the low crystallizing temperature and a ferroelectric with a simple crystal structure is used.

The semiconductor device of the present invention is characterized in that in a semiconductor device comprising a semiconductor substrate, impurity diffusion layers formed in the surface portions of the semiconductor substrate with a desired gap therebetween, an insulator layer bridged between the impurity diffusion layers on the semiconductor substrate and an electrode stacked on the insulator layer, the insulator layer being a ferroelectric of IV-VI compound.

Further, in the present invention, it is preferable that the insulator layer includes a main layer formed of a ferroelectric of IV-VI compound and a sub-layer formed of an insulating fluoride with a close packing structure formed on the one side surface or both side surfaces of the main layer.

Additionally, it is preferable that the IV-VI compound is GeTe, SnTe, or $Pb_xGe_{1-x}Te$ ($0.01 \leq X \leq 1.00$).

Furthermore, it is preferable that the insulating fluoride having the fluorite type structure is $CaF_2$ or $SrF_2$.

Since in the present invention, the IV-VI compound is used as the ferroelectric, a film can be formed in non-oxidizing atmosphere. Further, since the crystal structure is simple and the crystallizing temperature is low, the high temperature treatment is not required.

DETAILED DESCRIPTION OF THE INVENTION

The present invention will be described with reference to the embodiments referring to attached drawings. Nevertheless, the present invention is not limited to such embodiments.

Figure 1:
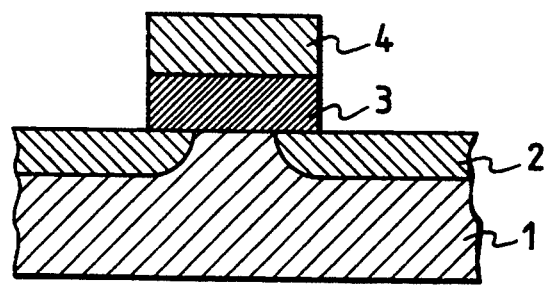
FIG. 1 is a cross-sectional view of a first embodiment of the present invention.
Figure 2:
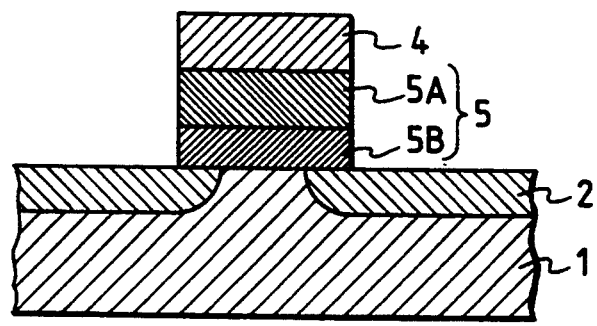
FIG. 2 is a cross-sectional view of a second embodiment of the present invention.

FIG. 1 is a cross sectional view of the first embodiment of the present invention and FIG. 2 is a cross sectional view of the second embodiment of the present invention. In the Figures, 1 denotes a semiconductor substrate, 2 denotes an impurity diffusion layer, 3 and 5 denote an insulator layer, and 4 denotes an electrode.

Since the semiconductor substrate 1, the impurity diffusion layer 2 and the electrode 4 are the same as used in a conventional MFS semiconductor device, the detailed explanation of the constitution will be omitted.

In the first embodiment shown in FIG. 1, the insulator layer 3 is constituted of one layer. As the material of the insulator layer 3, a component with a ferroelectric property among the IV-VI compound is used. The reasons why the compound is used are that a film is formed in a non-oxidizing atmosphere, the crystallizing temperature is about 230° C. which is low and that the crystal structure is simple. As the examples of the compound, GeTe, SnTe, or $Pb_xGe_{1-x}Te$ ($0.01 \leq X \leq 1.00$) can be selected. The film thickness of the formed insulator layer 3 can be suitably determined while taking material to be used and the purpose of use of a semiconductor device into consideration. As the example of the thickness, thin thickness of about 10 to 50 nm is preferable from consideration of decreasing a reverse voltage and levelling of the device structure. Nevertheless, thickness of about 500 nm does not badly influence the operation in consideration of leak current, etc., which flows in the ferroelectric.

In the second embodiment shown in FIG. 2, the insulator layer 5 is constituted of a main layer 5A and a sub-layer (buffer layer) 5B. In the second embodiment shown in FIG. 2, the sub-layer 5B is formed on the side of the semiconductor substrate 1. However, the position of the sub-layer 5B is not limited to the above-mentioned position. The sub-layer 5B can be formed on the side of the electrode 4 and on both sides of the semiconductor substrate 1 and/or the electrode 4. The reason why the sub-layer 5B is provided is that the diffusion of the constitutional elements of the main layer 5A to the semiconductor substrate 1 and/or the electrode 4 is prevented and the transfer of electrons between the main layer 5A and the semiconductor substrate 1 or the electrode 4 is prevented. From the point of view, as the material of the sub-layer 5B, a material with a close packing structure and low conductivity can be used. As the example of the material, an insulating fluoride with a close packing structure can be selected. In turn, as the example of the closest packing structure, a fluorite type structure can be selected. As the insulating fluoride with the fluorite type structure, $CaF_2$ (conductivity: $2.5/10^{14}$ ohm-cm) or $SrF_2$ can be selected. The thickness of the main layer 5A and the sub-layer 5B can be suitably determined while considering the purposes of the sub-layer 5B and the semiconductor. As the example, thin film of 5 nm or less, by which a sufficient barrier effect is generated is preferable when the increase of the operation voltage is considered. In view of surely obtaining the crystalline property and barrier property, the thickness of about 50 nm is acceptable, which does not badly influence the operation.

As a method of forming of the insulator layers 3 and 5 on the semiconductor substrate 1, various film formation methods, for example, an EB vapor deposition and a sputtering which have been conventionally used can be preferably used. Further, to improve the crystalline property, to select materials of each portion in the manner that the mismatch of the lattice constant is lessened in the formation of the film is preferable. When, for example, Si (1 0 0) (distance between lattices: 5.44 angstrom) is used as the semiconductor substrate 1, GeTe (1 1 1) (distance between lattices: 5.98 angstrom) can be used as the insulator layers 3 and 5A of a ferroelectric, $CaF_2$ (distance between lattices: 5.46 angstrom) or $SrF_2$ (distance between lattices: 5.799 angstrom) can be used as the sub-layer 5B.

When a film with good crystalline property or a single crystalline film is formed, use of the film formation method by the CVD, MBE, ICB or ALE is preferable.

As described above, according to the present invention, the oxide ferroelectric is not used as a ferroelectric. Therefore, a film can be formed in a non-oxidizing atmosphere and unnecessary film is not formed on the semiconductor substrate. Further, since the crystallizing temperature is about 230° C. which is low, the high temperature treatment is not required. Furthermore, since the crystal structure is simple, the process can be simplified.

What is claimed is:

1. A semiconductor device, comprising:
   a semiconductor substrate;
   impurity diffusion layers formed in the surface portions of said semiconductor substrate with a desired gap therebetween;
   an insulator layer bridged between said impurity diffusion layers on said semiconductor substrate, said insulator layer comprising a nonoxide ferroelectric IV-VI compound; and
   an electrode stacked on said insulator layer.

2. A semiconductor device according to claim 1, wherein said insulator layer includes a main layer comprising a nonoxide ferroelectric IV-VI compound and a sub-layer comprising an insulating fluoride with a close packing structure disposed on at least one surface of said main layer.

3. A semiconductor device according to claim 1, wherein said IV-VI compound is selected from the group consisting of GeTe, SnTe, and $Pb_xGe_{1-x}Te$ ($0.01 \leq X \leq 1.00$).

4. A semiconductor device according to claim 2, wherein said IV-VI compound is selected from the group consisting of GeTe, SnTe, and $Pb_xGe_{1-x}Te$ ($0.01 \leq X \leq 1.00$).

5. A semiconductor device according to claim 2, wherein said close packing structure is a fluorite type structure.

6. A semiconductor device according to claim 4, wherein said close packing structure is a fluorite type structure.

7. A semiconductor device according to claim 5, wherein said insulating flouride having the fluorite type structure is selected from the group consisting of $CaF_2$ and $SrF_2$.

8. A semiconductor device according to claim 6, wherein said insulating flouride having the fluorite type structure is selected from the group consisting of $CaF_2$ and $SrF_2$.

* * * * *